(12) United States Patent
Gersdorff

(10) Patent No.: US 8,685,500 B2
(45) Date of Patent: Apr. 1, 2014

(54) METHOD FOR DEPOSITING A THIN-FILM POLYMER IN A LOW-PRESSURE GAS PHASE

(75) Inventor: Markus Gersdorff, Herzogenrath (DE)

(73) Assignee: Aixtron AG, Herzogenrath (DE)

( * ) Notice: Subject to any disclaimer, the term of this patent is extended or adjusted under 35 U.S.C. 154(b) by 174 days.

(21) Appl. No.: 12/995,439

(22) PCT Filed: May 14, 2009

(86) PCT No.: PCT/EP2009/055795
§ 371 (c)(1),
(2), (4) Date: Nov. 30, 2010

(87) PCT Pub. No.: WO2009/147005
PCT Pub. Date: Dec. 10, 2009

(65) Prior Publication Data
US 2011/0081504 A1   Apr. 7, 2011

(30) Foreign Application Priority Data

Jun. 3, 2008 (DE) .......................... 10 2008 026 973
Apr. 14, 2009 (DE) .......................... 10 2009 003 781

(51) Int. Cl.
*C23C 8/00* (2006.01)
*C23C 16/52* (2006.01)
*C23C 16/00* (2006.01)

(52) U.S. Cl.
USPC ................... 427/585; 427/248.1; 427/255.23; 427/255.6; 427/8

(58) Field of Classification Search
USPC ................... 427/248.1, 255.23, 255.6, 585, 8
See application file for complete search history.

(56) References Cited

U.S. PATENT DOCUMENTS

| | | |
|---|---|---|
| 3,288,728 A | 11/1966 | Gorham |
| 3,908,046 A | 9/1975 | Fitzpatrick et al. |

(Continued)

FOREIGN PATENT DOCUMENTS

| | | |
|---|---|---|
| DE | 10136858 A1 | 9/2002 |
| EP | 0862664 B1 | 1/2003 |

OTHER PUBLICATIONS

Lee, Taejin et al., "Characterization of Parylene deposition Process for the Passivation of Organic Light Emitting Diodes," Korean J. Chem. Eng. 19(4), 722-727 (2002).

(Continued)

*Primary Examiner* — Kelly M Gambetta
(74) *Attorney, Agent, or Firm* — Ascenda Law Group, PC

(57) ABSTRACT

The invention relates to a method for depositing one or more thin layers. In said method, a process gas forming a polymer streams into a deposition chamber (8) along with a carrier gas by means of a gas inlet element (3) in order to deposit a thin layer, in particular in the form of a polymer, on the surface (7') of a substrate (7) which lies on a supporting surface (4') of a susceptor, said supporting surface (4') lying opposite the gas inlet element (3), at a distance therefrom. In order to allow the coating process to be carried out at substrate temperatures that only slightly exceed the temperature of the supporting surface of the susceptor, the gas inlet element (3) and/or the supporting surface (4') are/is temperature-controlled in such a way that the temperature (TS) of the supporting surface (4') is lower than the temperature (TG) of the gas inlet element (3). More particularly, at a first pressure (P1) prevailing in the deposition chamber (8) before the process gas penetrates into the deposition chamber (8), the substrate (7) lying on the supporting surface (4') is stabilized, by dissipating heat to the susceptor (4), to a substrate temperature (TD) that only slightly exceeds the temperature (TS) of the supporting surface (4') but is significantly lower than the temperature (TG) of the gas inlet element (3), whereupon the pressure (P1) in the deposition chamber (8) is reduced to a process pressure (P2), and the process gas penetrates into the deposition chamber (8) when the process pressure (P2) has been reached.

17 Claims, 2 Drawing Sheets

(56) References Cited

U.S. PATENT DOCUMENTS

| | | | |
|---|---|---|---|
| 4,945,856 A | | 8/1990 | Stewart |
| 5,554,220 A | | 9/1996 | Forrest et al. |
| 5,804,259 A | * | 9/1998 | Robles ............... 427/577 |
| 5,958,510 A | | 9/1999 | Sivaramakrishnam et al. |
| 6,133,148 A | * | 10/2000 | Won et al. ............ 438/680 |
| 6,362,115 B1 | | 3/2002 | Mandal |
| 6,709,715 B1 | | 3/2004 | Lang et al. |
| 2004/0006621 A1 | | 1/2004 | Bellinson |
| 2006/0113507 A1 | | 6/2006 | Teleshov et al. |
| 2008/0241380 A1 | | 10/2008 | Suzuki |

OTHER PUBLICATIONS

International Search Report and Written Opinion of the International Search Authority for PCT/EP2009/055795 (13 pg.) dated Aug. 12, 2009.
Communication from EPO dated Jan. 12, 2011, 2 pages.
IPER (English Translation) dated Dec. 6, 2010, 8 pages.
Request for Entry into the European Phase dated Dec. 14, 2010, 13 pages.

* cited by examiner

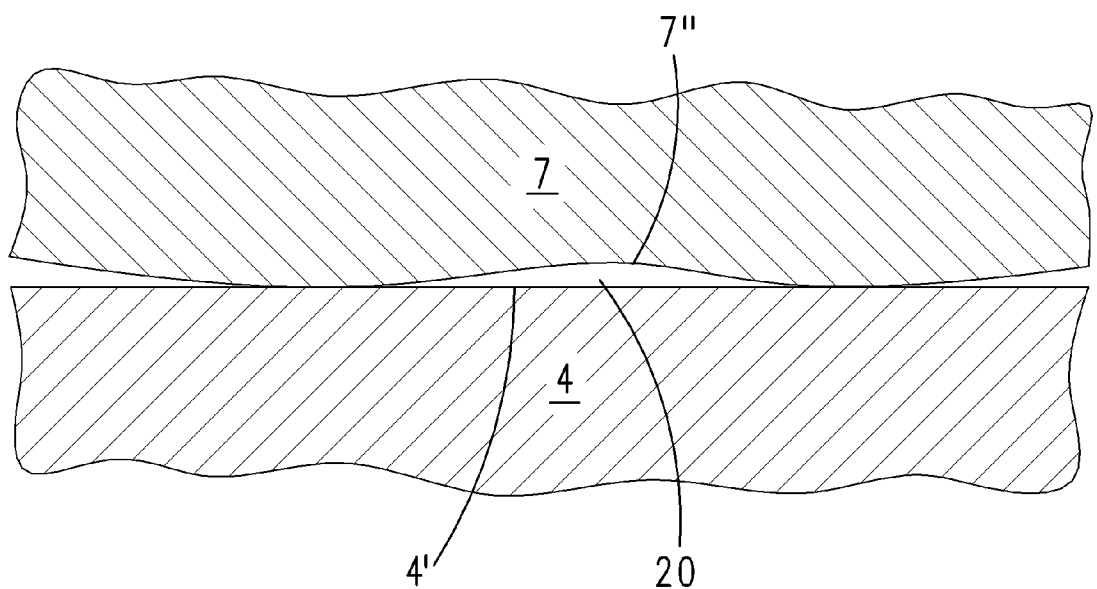

METHOD FOR DEPOSITING A THIN-FILM POLYMER IN A LOW-PRESSURE GAS PHASE

CROSS REFERENCE TO RELATED APPLICATIONS

This is a NATIONAL STAGE under 35 USC 371 of and claims priority to International Application PCT/EP2009/055795, filed 14 May 2009, incorporated herein by reference, which claims priority to DE 10 2008 026973.5, filed 3 Jun. 2008, and DE 10 2009 003781.0, filed 14 Apr. 2009.

FIELD OF THE INVENTION

The invention relates to a method for depositing one or more thin layers, in particular in the form of a polymer, on the surface of a substrate.

BACKGROUND

A method of the kind described above is known from U.S. Pat. No. 4,945,856. In this a solid para-xylylene is brought into the form of a gas. The gas is conducted through gas lines into a pyrolysis chamber, where the dimer is decomposed into a monomer. The monomer is conducted, together with the carrier gas, through a further gas line that has a gas inlet element into a deposition chamber, where it is polymerized on a substrate which lies on a cooled susceptor. Para-xylylene copolymers are described by U.S. Pat. No. 3,288,728. These are C, N, D polymers of the family of parylenes that are in the form of a solid powder or a liquid at room temperature.

It is known from "Characterization of Parylene Deposition Process for the Passivation of Organic Light Emitting Diodes", Korean J. Chem. Eng., 19(4), 722-727 (2002) to passivate, in particular to encapsulate, OLEDs with layers of poly-p-xylyene and derivatives thereof. Otherwise, it is known to provide various large-area substrates with a parylene coating in a vacuum. For example, glass, metal, paper, paint, plastics, ceramic, ferrite and silicone are coated with a pore-free, transparent polymer film by condensation from the gas phase. This exploits the hydrophobic, chemically resistant and electrically insulating property of the polymeric coating.

U.S. Pat. No. 5,554,220 describes a so-called OVPD process, by which so-called OLEDs (Organic Light Emitting Devices) can be produced. DAST is mentioned, inter alia, in this as a starting material.

DE 101 36 858 describes an apparatus and a method for the production of coated substrates, the layer being applied to a substrate by means of a condensation process. The substrate may be glass, a film or plastics. With the apparatus described here, light emitting components, in particular thin-film components such as OLEDs, may be produced. The organic layers are deposited in a structured way, using a mask, to a large area of the substrate. The apparatus has a temperature-controlled gas inlet element in the form of a gas distributor of large area and a susceptor for receiving a substrate, which is cooled and is located below the distributor.

EP 0 862 664 B1 relates to a method and an apparatus for the deposition of parylene on semiconductor substrates. Parylene is evaporated in an evaporation chamber. The evaporated parylene is decomposed in a pyrolysis chamber. The products of decomposition reach a process chamber through a gas inlet element and form a layer on a substrate that is cooled to below 15° C. The substrate holder may be heated up to 400° C. by means of a heater.

US 2006/0113507 A1 likewise relates to a parylene deposition process under vacuum conditions. Here, a liquid crystal polymer film is deposited in a single-step process. The process takes place in a three-zone reactor, which has a sublimation zone, a pyrolysis zone and a condensation zone with an operating temperature from 450° C. to 700° C. The sublimation is said to take place at a temperature between 15° C. and 100° C. The condensation and the simultaneous polymerization is said to take place at a temperature between 210° C. and 290° C.

U.S. Pat. No. 6,709,715 B1, U.S. Pat. No. 6,362,115 B1 and U.S. Pat. No. 5,958,510 A disclose a method for depositing parylene layers by use of an apparatus in which a polymeric starting material is first of all evaporated, is then decomposed and the decomposition products are introduced into a heated process chamber through a large-area gas distributor. Condensation takes place on substrates, which lie on a cooled susceptor.

U.S. Pat. No. 3,908,046 relates to a para-xylylene polymer deposition method, which also encompasses the process steps of sublimation, pyrolysis and deposition. Here, the substrate temperature is held in a range from 25° C. to 30° C.

The coating process for deposition of the OLEDs or the polymers takes place in a deposition chamber in which there is a vertical temperature gradient in the gas phase. The gas inlet element has a higher temperature than the substrate. The substrate has therefore to be cooled by support on the substrate. Heat transferred to the substrate from the gas inlet element by radiation must be conducted away to the susceptor. Since the coating process takes place as a rule in the presence of a pressure in the sub-mbar range, the removal of the heat can only be effected by contacting surface portions between the substrate and the supporting surface of the susceptor. It is naturally the case that for the two surfaces of the supporting surface on the one hand and the lower side of the substrate on the other hand that lie on one another, a true contact that allows heat conduction is only present sporadically. On account of the unavoidable lack of evenness of the two surfaces, intervening gap spaces are formed with gap widths of up to 100 μm. In the case of a process pressure of less than 1 mbar, there is no longer any heat transfer by convection in this gap. This results in the surface of the substrate to be coated being heated up by the radiation emitted by the heated gas inlet element to temperatures which are significantly above the temperature of the susceptor.

SUMMARY OF THE INVENTION

It is therefore an object of the invention to provide a method by which the coating process can be carried out at substrate temperatures which are only slightly higher than the temperature of the supporting surface of the susceptor.

The object is achieved by the invention specified in the claims, each claim basically representing an independent way of achieving the object of the invention, the subclaims preferably being combined with the main claim.

First and foremost, it is provided that the temperatures of the gas inlet element and/or the supporting surface are controlled in such a way that the temperature of the supporting surface is lower than the temperature of the gas inlet element, the substrate supported on the supporting surface being stabilized at a substrate temperature by flow of heat to the susceptor at a time before the process gas enters the deposition chamber when the pressure in the deposition chamber is at a first pressure, which is preferably in the millibar range, the substrate temperature being only slightly higher than the temperature of the supporting surface but considerably lower than the temperature of the gas inlet element, the pressure in the deposition chamber being subsequently reduced to a process pressure, which is preferably in the sub-millibar range, and the process gas entering the deposition chamber when the process pressure has been reached. The method is especially suitable for depositing one or more thin layers of polymeric material, in particular para-xylylene, a solid or liquid starting material formed in particular from a polymer, especially a dimer, being evaporated in an evaporator, and the starting material, in particular the dimer, being transported by means of a carrier gas from the evaporator through a carrier gas line into a pyrolysis chamber, being decomposed pyrolytically in the pyrolysis chamber, in particular into a monomer, the decomposition product, in particular monomer, being transported out of the pyrolysis chamber into a deposition chamber by the carrier gas, there flowing into the deposition chamber through a gas inlet element and being polymerized as a thin layer on the surface of a substrate supported on a supporting surface of a susceptor, and the carrier gas and a non-polymerized portion of the decomposition product, in particular monomer, exiting from the process chamber out of a gas outlet. The method is likewise especially well suited to the deposition of OLEDs. The usually liquid or solid starting materials are converted into a gaseous form in this OVPD process in so-called sources, for example by evaporation, and then transported through gas lines to the deposition chamber by use of a carrier gas. A gas inlet element is in the chamber. The gas inlet element and in particular the gas discharge surface formed by the gas inlet element are preferably gold-plated or at least highly-polished. The gold-plated, highly-polished surface of the gas discharge surface thus has an emissivity $\in$, which is the range less than 0.04. Because of this, the radiation power of the heated gas inlet element, which is heated up to a temperature in the range between 150° C. and 250° C., is minimized. In spite of this, heat is transferred to the substrate and this must flow away to the cooled susceptor. The temperature of the susceptor is controlled in the range from $-30°$ C. to 100° C. The temperature difference between the supporting surface and the gas inlet element is thus at a minimum 50° C., often indeed at least 100° C. The invention pertains substantially to a pre-thermalization (establishment of thermal equilibrium) of the substrate, which is carried out before the actual coating process. While the coating process is carried out in the sub-mbar region, thus in particular at pressures between 0.5 and 0.05 mbar and preferably at a total pressure of approximately 0.1 mbar, the thermalization (establishment of thermal equilibrium) preceding the coating process is effected with a total pressure in the deposition chamber of >1 mbar, for example with a total pressure of approximately 5 mbar. After the substrate has been introduced into the process chamber a carrier gas which may be a noble gas or another gas that is reaction-passive and is in particular inert, flows initially through the gas inlet element into the process chamber. It exits again out of the process chamber through a gas outlet. It is sucked out by a vacuum pump. The process pressure within the deposition chamber is regulated by a valve disposed upstream of the vacuum pump. A process pressure is initially is initially set which is greater than 1 mbar and is preferably approximately 5 mbar. At this thermalizing pressure, the temperature profile in the deposition chamber is adjusted. This means that the gas inlet element and in particular the gas discharge surface facing the supporting surface is brought to a process temperature in the range between 150° C. and 250° C. The temperature of the susceptor is adjusted to a susceptor temperature in the range between $-30°$ C. and 100° C. This takes place at a pressure at which the average free path length of the gas molecules is considerably less than the gap width of the gap between the underside of the substrate and the supporting surface, so that a convective transfer of heat from the substrate to the susceptor can take place in the gap. In this first process step, the substrate temperature is stabilized at a temperature which is only a few degrees higher than the temperature of the supporting surface. The temperature difference between the substrate temperature and the susceptor temperature is less than 10° C. The lateral deviations in temperature on the substrate surface are in the region of 1° C. at a maximum. The temperature stabilizing process can be monitored by pyrometric or other means. A temperature sensor is provided by which the temperature of the surface of the substrate can be measured preferably by measuring the temperature of the radiation emitted by the substrate. Also the other temperatures, thus the temperature of the gas inlet element and the temperature of the susceptor, are measured by suitable measuring elements, which here may also be thermocouples. When a steady-state-condition is, reached, in which the temperature of the substrate surface has reached a desired value, the pressure in the deposition chamber is very quickly reduced by means of the control valve disposed upstream of the vacuum pump. The pressure in the deposition chamber usually reaches a stabilized process pressure, which is approximately 0.1 mbar, within two to ten seconds. At this process pressure, the molecules of the carrier gas have an average free path length which is too great for convective transport of heat to be able to take place within the gap between the substrate and the supporting surface. At this pressure, the substrate is substantially thermally isolated from the susceptor apart from the individual contact points by which the underside of the substrate is supported on the susceptor. This has the result that the radiant heat coming from the gas inlet element and absorbed by the substrate can no longer be taken away to a sufficient extent so that the temperature difference between the substrate and the susceptor continuously increases. The growth rates of the deposition process are however so great that the growth times may be only a few seconds, for example 1 to 4 seconds. Since the growth times are therefore less than 10 seconds, the time remaining to heat up the substrate as a result of there being no convective cooling is less than 20 seconds. The heat capacity of the substrate is sufficiently great, so that the rise in the temperature of the substrate taking place in this time can be tolerated. The method is suitable in particular for use in an apparatus in which the carrier gas exits from gas discharge ports of a gas discharge surface of a gas inlet element, in which the carrier gas and the process gas transported by the carrier gas flows into the process chamber in the form of "gas jets". The gas jets flow through a multiplicity of gas discharge ports into the process chamber and combine there into a gas volume flow extending over the entire supporting surface, in the direction of the supporting surface. The gas discharge surface thereby has a surface extent that is greater than the extent of the area of the supporting surface and in particular than the extent of the area of the substrate. The radiation-emitting area of the gas inlet element is correspondingly large. The radiation emitted by the gas discharge surface is however minimized as a result of the minimization of the emissivity by gold-plating and highly-polished treatment of the surface. A para-xylylene or substituted para-xylylene decomposed to a monomer is preferably used as process gas. This is to be deposited on the surface of the substrate as a polymer. The growth rates are in the range from 100 nm/sec.

to 200 nm/sec. At these growth rates, the required layer thicknesses of 100 nm to 1000 nm are deposited in a few seconds.

BRIEF DESCRIPTION OF THE DRAWINGS

Exemplary embodiments of the invention are explained on the basis of accompanying drawings, in which:

FIG. 2 shows a greatly enlarged extract II from FIG. 1 for schematic explanation of the gap between the supporting surface 4' and the underside 7" of the substrate 7.

DETAILED DESCRIPTION

Figure 1:
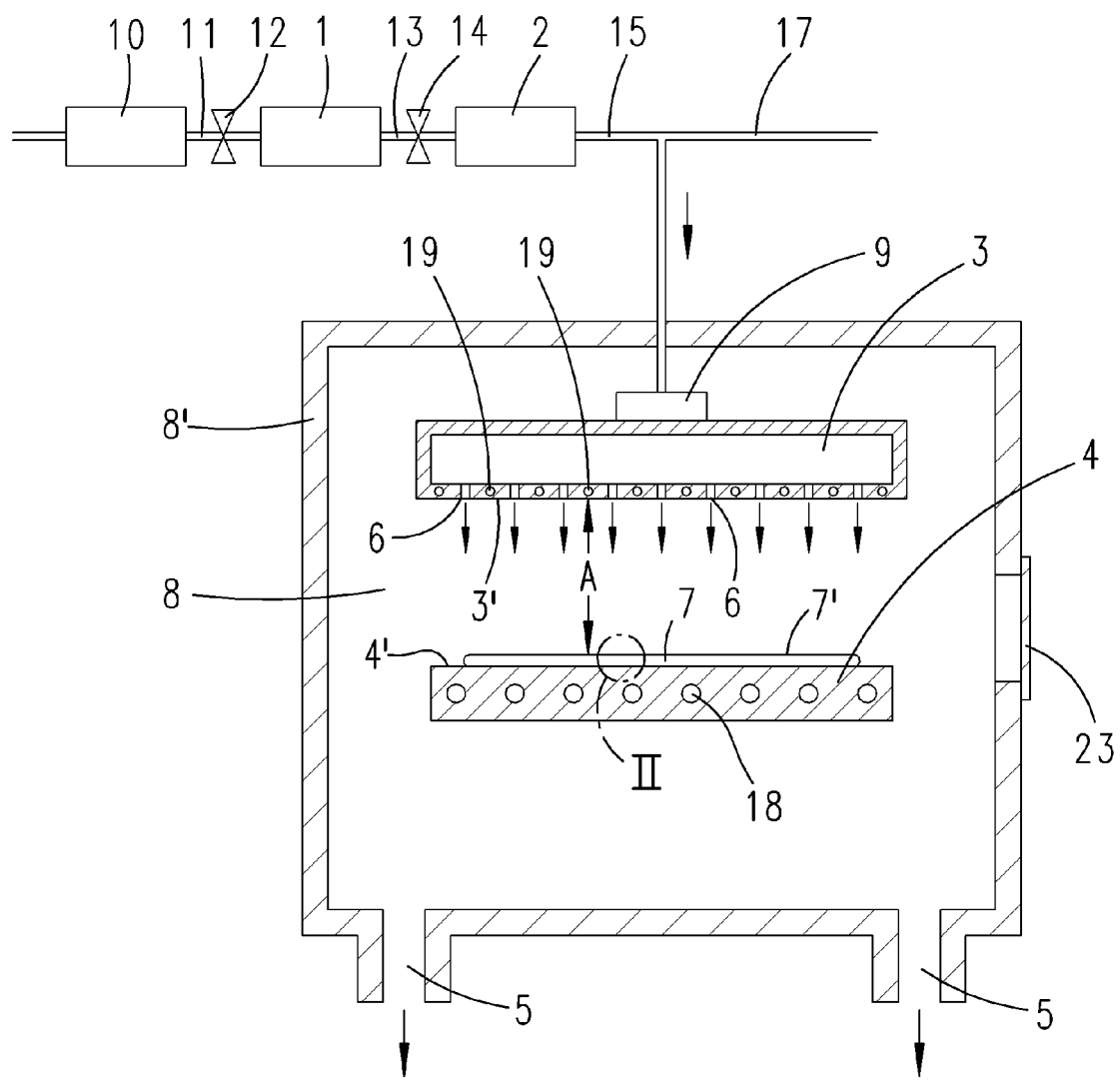
FIG. 1 schematically shows the main component parts of the coating apparatus and, in particular, the internal structure of the deposition chamber.

The invention relates to a method for depositing one or more thin layers. A process gas, in particular a process gas forming a polymer, flows, together with a carrier gas, into a deposition chamber by means of a gas inlet element, in order to deposit a thin layer, in particular in the form of a polymer, on the surface of a substrate lying on a supporting surface of a susceptor, the supporting surface being located opposite the gas inlet element and at a spacing from it.

A gas supply, not illustrated, provides a carrier gas, for example, helium, argon or nitrogen, which is metered by a mass flow controller 10. The carrier gas flows through a gas line 11, which can be closed by a valve 12, into an evaporator 1, in which a liquid or solid starting material is held. This starting material is a polymer. For example, it may be a polymer, for example para-xylylene or substituted para-xylylene, for example C, N, D para-xylylene. The powder or the liquid is heated to a source temperature of 50° C. to 200° C. At this temperature, the starting material evaporates in the form of a dimer. The dimer is conducted through the gas line 13, which can be closed by a valve 14, to a pyrolysis chamber 2. A temperature between 350° C. and 700° C. prevails in the pyrolysis chamber 2. At this temperature, the dimer is pyrolytically decomposed into a monomer. By way of a likewise heated supply line 15, the carrier gas is introduced together with the process gas into a gas inlet element 3 by way of an input distributor 9.

The flow resistances in the entire system are set so that a gas pressure of less than 1 mbar prevails within the pyrolysis chamber. The speed of flow is set such that the starting materials have a dwell time in the pyrolysis chamber which is sufficient for the starting material to be more or less completely decomposed.

Reference numeral 17 designates a supply line through which gases may also be introduced into the input distributor 9. However, only the carrier gas can be introduced into the input distributor 9 through the supply line 17. A vent/run system, not illustrated, may be provided in order to stabilize gas flows before entry into the input distributor 9.

The gas inlet element 3 has a shower-head-like configuration with a central chamber, into which the gas is introduced, uniformly distributed, by means of the input distributor 9. The base of the chamber is formed by a plate which has through ports 6 arranged in uniform distribution over the surface area in the manner of a sieve. Located in the plate, the underside of which forms a gas discharge surface 3', are heating wires or heating channels 19 through which an electric current or a heating fluid may flow. By means of the resistance heating or by another kind of heating, the gas inlet element and in particular the gas discharge surface 3' can be heated up to temperatures in the range between 150° C. and 250° C. For this, the diameter of the gas discharge openings 6, all of which are similarly configured, is selected so that the loss of pressure through the ports is less than 0.5 mbar.

A susceptor 4 is at a spacing A beneath the gas discharge surface 3', the spacing A being very much less than a characteristic diameter or a characteristic diagonal of the gas discharge surface 3'. The supporting surface 4' of the susceptor 4 that faces the gas discharge surface 3' has an area of an extent which is less than the extent of the area of the gas discharge surface 3'. The susceptor 4 is formed as a cooling block and has channels 18, through which a cooling medium flows.

The deposition chamber 8, extending between the gas discharge surface 3' and the supporting surface 4', is located in a reactor, the housing wall of which is designated by 8'. The housing wall has a loading gate 23 and gas outlet ports 5, through which the carrier gas and the rest of the process gas can be sucked out by a vacuum pump.

The susceptor 4 is cooled in a manner such that its surface 4' has a susceptor temperature TS in the range from 0° C. to −50° C. The temperature TG of the gas inlet element 3 is higher than the susceptor temperature TS by at least 50° C., preferably in fact at least 100° C. higher. In order to minimize the transport of heat from the gas inlet element 3 to the susceptor 4, at least the gas discharge surface 3' is highly polished and in particular gold-plated so that its emissivity is less than 0.04.

The substrate 7 lies on the susceptor 4 that consists of stainless steel, aluminum or copper. It is at a spacing A of 25 mm to 50 mm beneath the gas discharge surface 3'. The substrate may be a dielectric substrate or a non-dielectric substrate, for example a display, a silicon wafer, or paper or a plastics film. If the substrate is of a flat, flexible form, it may also be supported on a substrate carrier. There is in addition a shadow mask, not illustrated, in order to structure the coating laterally. The substrate may also be pre-coated.

FIG. 2 shows schematically the contact of the underside 7" of the substrate on the supporting surface 4' of the susceptor 4. Although both surfaces are substantially planar, intervening gap spaces 20 between the underside 7" and the supporting surface 4' are unavoidable. They are caused by manufacture or occur on account of thermal deformation. The gap width of this gap 20 is in the range between 20 μm and 100 μm. The gaps take up a greater area than the contact zones of the underside 7" of the substrate on the supporting surface 4'. The substrate has therefore surface engagement against the susceptor only here and there.

Under typical process conditions, the temperature TG of the gas inlet element 3 is about 200° C. and the temperature TS of the supporting surface 4' is in the range between 0° C. and −50° C., preferably however around about 0° C. The temperature TD of the surface of the substrate 7 should as far as possible be only slightly higher that the temperature TS of the supporting surface 4'. The temperature difference should, at a maximum, be in the region of 10° C. The gas discharge surface 3', the temperature of which is controlled to 200° C., extends however outwards beyond the surface of the substrate 7 and thus transmits a considerable amount of thermal energy to the substrate 7 by thermal radiation. The radiation output is in fact minimized by the mirror finish of the gold-plated area of the gas discharge surface 3'. Nonetheless however, it leads to a significant flow of heat to the substrate. This flow of heat must be conducted away by a heat conducting transfer area at the susceptor 4 of the greatest possible extent. The temperature difference between the substrate 7 and the susceptor 4 has to be minimized.

On account of the limited direct contact area between the substrate 7 and the susceptor 4, good transport of heat across the gap 20 is required. At a process pressure P2 of typically 0.1 mbar, there prevail conditions that are practically isolating, since the free path length of the gas molecules is too great for convective heat transport to be able to take place between the two surfaces 7" and 4' that are spaced apart from one another.

According to the invention, the entire deposition unit 3, 4, including the substrate 7 lying on the supporting surface 4', is therefore brought into a steady-state condition at air elevated pressure P1, before the actual coating process, in which condition the inlet element 3 has reached the temperature TG, the susceptor 4 and in particular the supporting surface 4' has reached the temperature TS, and the surface of the substrate 7 has reached the substrate temperature TD. The substrate temperature TD is then only a little higher than the temperature TS. The temperature difference is less than 10° C. This stabilization of temperature is reached by the thermalization pressure used here being greater than 1 mbar and being about 5 mbar, thus that it has a value at which the average free path length of the gas molecules is sufficiently small in order to guarantee convective heat transport in the gap 20 between the substrate 7 and the supporting surface 4'.

When the steady-state condition is reached, the suction power of the vacuum pump is drastically increased by means of a control valve which is located upstream of the vacuum pump, so that within 2 to 10 seconds, the total pressure in the deposition chamber 8 is reduced to the process pressure P2. The process pressure is in the sub-mbar range and is approximately 0.1 mbar. As soon as this process pressure P2 is reached, there follows the actual coating at a growth rate of about 100 nm/sec, until the typical layer thickness of approximately 200 nm is reached.

It must be accepted that when the lowering of the total pressure is started, the convective cooling mechanism between the substrate 7 and the susceptor 4 is suspended and the substrate 7 is then heated. The rise in temperature is however tolerable on account of the pressure reduction phase and growth phase lasting only a few seconds.

It is possible to coat substrates of large surface area by use of the method described above. The supporting surface 4' may have for example an area of a square meter.

A further exemplary embodiment of the method according to the invention relates to the deposition of so-called OLEDs (Organic Light Emitting Devices). This is also a thermal vacuum process. The usually liquid or solid starting materials are held in temperature-controlled vessels, the so-called sources. The starting materials are converted into a gaseous form by evaporation, and are then transported into the deposition chamber 8 through a gas line 15, 17. Here there is a gas inlet element 3 for distributing and for metering the process gas transported in the carrier gas. The process gas enters the process chamber 8 through the ports 6 and condenses there on the cooled substrate 7. The substrate is supported on a cooled susceptor 4. Deposition of the layer takes place at temperatures considerably below 200° C. This is necessary because the starting materials used are very temperature-unstable. While the substrate temperature TD thus has a low value, the gas inlet temperature TG has a significantly higher value, for example the temperature at which the starting material evaporates. In order to avoid the surface of the substrate heating up to excessively high values as a result of heat radiation from the gas inlet element 3, the process chamber is held at a pressure P1 before the actual deposition process, the pressure P1 being considerably above the pressure P2 at which the process step is carried out. At the pressure P1, heat exchange between the substrate and the substrate holder takes place in the clearance zones between the underside of the substrate and the upper side of the substrate holder. The process is carried out at a process pressure P2, which is appreciably less. At this process pressure P2, significantly reduced heat transport takes place by heat conduction in the gap between the underside of the substrate and the upper side of the susceptor.

All features disclosed are (in themselves) pertinent to the invention. The disclosure content of the associated/accompanying priority documents (copy of the prior patent application) is also hereby incorporated in full in the disclosure of the application, including for the purpose of incorporating features of these documents in claims of the present application.

What is claimed is:

1. A method for depositing a thin layer on a surface (7') of a substrate (7), the substrate (7) supported on a supporting surface (4') of a susceptor (4), the substrate further contained within a deposition chamber (8), the deposition chamber (8) having a gas inlet element (3), the method comprising:
    at a time before process gas enters the deposition chamber (8), setting the deposition chamber (8) at a first pressure (P1);
    while the deposition chamber is set at the first pressure (P1), adjusting a temperature (TD) of the substrate (7) by flowing heat from the substrate (7) to the susceptor (4), the substrate temperature (TD), when stabilized, being only slightly higher than a temperature (TS) of the supporting surface (4'), but considerably lower than a temperature (TG) of the gas inlet element (3);
    after the substrate temperature (TD) has stabilized, reducing the pressure in the deposition chamber (8) from the first pressure (P1) to a process pressure (P2);
    after the pressure in the deposition chamber (8) has reached the process pressure (P2), flowing the process gas, together with a carrier gas, into the deposition chamber (8) by means of the gas inlet element (3), in order to deposit the thin layer on the surface (7') of the substrate (7); and
    while the process gas is flowing into the deposition chamber (8), (i) delivering heat from the gas inlet element (3) to the substrate (7) and (ii) removing heat from the substrate (7) by flowing heat from the substrate (7) to the susceptor (4), the heat delivered to the substrate (7) being greater that the heat removed from the substrate (7) thereby continuously increasing the substrate temperature (TD).

2. The method of claim 1, wherein the carrier gas and the process gas exit from ports (6) of a gas discharge surface (3') of the gas inlet element (3), the gas discharge surface (3') having a high-gloss finish and being gold-plated.

3. The method of claim 1, wherein the gas inlet element (3) forms a gas discharge surface (3') in the manner of a shower head, and is heated.

4. The method of claim 1, wherein the gas inlet element (3) is heated by means of electric heating wires or channels (19) through which liquid flows.

5. The method of claim 4, wherein the electrical heating wires or the channels (19) through which liquid flows are located in a front plate of the gas inlet element (3), the front plate forming a gas discharge surface (3').

6. The method of claim 1, wherein the susceptor (4), which is formed by a cooling block, is actively cooled.

7. The method of claim 1, wherein the gas inlet element temperature (TG) is higher than the supporting surface temperature (TS) by at least 50° C., and preferably is at least 100° C. higher.

8. The method of claim 1, wherein the gas inlet element temperature (TG) is in a range between 150° C. and 250° C., and is preferably approximately 200° C.

9. The method of claim 1, wherein a temperature of the susceptor (4) is in a range between −30° C. and 100° C., and is preferably below 0° C.

10. The method of claim 1, wherein the process pressure (P2) is less than 1 mbar and is preferably in a range between 0.5 mbar and 0.05 mbar, and is especially preferably 0.1 mbar.

11. The method of claim 1, wherein the substrate temperature (TD), when stabilized, is less than 100° C., preferably less than 10° C., and the first pressure (P1) in the deposition chamber (8) is more than 1 mbar, preferably approximately 5 mbar.

12. The method of claim 1, wherein the process gas is of an evaporated monomer or a polymeric starting material, in particular para-xylylene or substituted para-xylylene.

13. The method of claim 1, wherein the process gas is evaporated liquid or solid starting materials, which condense on the substrate (7) as light limiting or photovoltaic layers, in particular in the form of OLEDs (Organic Light Emitting Devices).

14. The method of claim 1, further comprising determining that the substrate temperature (TD) has stabilized while the deposition chamber (8) is set at the first pressure (P1), such that the heat delivered to the substrate (7) is equal to the heat removed from the substrate (7), using a pyrometer.

15. The method of claim 1, wherein delivering heat from the gas inlet element (3) to the substrate (7) comprises radiating heat from the gas inlet element (3) to the substrate (7) across the deposition chamber (8).

16. The method of claim 15, wherein removing heat from the substrate (7) comprises convectively transporting heat across a gap between the substrate (7) and the susceptor (4).

17. The method of claim 16, further comprising reducing the convective transport of heat across the gap between the substrate (7) and the susceptor (4) by reducing the pressure in the deposition chamber (8) from the first pressure (P1) to the process pressure (P2).

* * * * *